United States Patent
Strachan et al.

(10) Patent No.: US 10,380,386 B1
(45) Date of Patent: Aug. 13, 2019

(54) ACCELERATOR FOR K-MEANS CLUSTERING WITH MEMRISTOR CROSSBARS

(71) Applicant: HEWLETT PACKARD ENTERPRISE DEVELOPMENT LP, Houston, TX (US)

(72) Inventors: John Paul Strachan, San Carlos, CA (US); Catherine Graves, Palo Alto, CA (US); Suhas Kumar, Palo Alto, CA (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 0 days.

(21) Appl. No.: 15/966,600

(22) Filed: Apr. 30, 2018

(51) Int. Cl.
*G06G 7/16* (2006.01)
*H03M 1/00* (2006.01)
*G11C 13/00* (2006.01)
*G06F 16/35* (2019.01)

(52) U.S. Cl.
CPC .............. *G06G 7/16* (2013.01); *G11C 13/00* (2013.01); *H03M 1/001* (2013.01); *G06F 16/35* (2019.01)

(58) Field of Classification Search
CPC . G06F 17/16; G06F 17/30705; H04L 49/101; H03M 1/001; G11C 13/0069; G06G 7/16
See application file for complete search history.

(56) References Cited

U.S. PATENT DOCUMENTS

| | | | |
|---|---|---|---|
| 5,856,930 A * | 1/1999 | Hosono | G11B 7/004 375/240.25 |
| 6,005,625 A * | 12/1999 | Yokoyama | H04N 19/543 19/543 |
| 8,175,407 B2 * | 5/2012 | Okawa | G06K 9/622 382/164 |
| 2015/0186458 A1 | 7/2015 | Gupta | |
| 2016/0357840 A1 * | 12/2016 | Odashima | G06F 17/30592 |

(Continued)

OTHER PUBLICATIONS

Chung, C-C. et al.; "Hadoop Cluster with Fpga-based Hardware Accelerators for K-means Clustering Algorithm"; Jun. 12-14, 2017; 2 pages.

(Continued)

*Primary Examiner* — Vanthu T Nguyen
(74) *Attorney, Agent, or Firm* — Nolte Intellectual Property Law Group

(57) ABSTRACT

A crossbar array includes a number of memory elements. A vector input register has N voltage inputs to the crossbar array. A vector output register has M voltage outputs from the crossbar array. An analog-to-digital converter (ADC) is electronically coupled to the vector output register. A digital-to-analog converter (DAC) is electronically coupled to the vector input register. A clustering processor is electronically coupled to the ADC and to the DAC. The clustering processor is configured to program columns of the crossbar array with a set of k cluster center values; apply voltages to rows of the crossbar array where the applied voltages represent a set of data values; and determine a minimum distance of each data value to each k cluster center values based on the voltage output from the output register of each of the plurality of the programmed columns.

17 Claims, 4 Drawing Sheets

(56) References Cited

U.S. PATENT DOCUMENTS

2017/0228345 A1* 8/2017 Gupta .................. G06F 17/141
2018/0309451 A1* 10/2018 Lu .................... H03K 19/17748

OTHER PUBLICATIONS

Hasan, R.; "Memristor Based Low Power High Throughput Circuits and Systems Design"; May 2016; 190 pages.

Kaplan, R. et al.; "PRINS: Processing-in-storage Acceleration of Machine Learning"; 2018; 2 pages.

Merkel, C. et al.; "Unsupervised Learning in Neuromemristive Systems"; Jan. 27, 2016; 3 pages.

Tissari, J. et al.; "K-means Clustering in a Memristive Logic Array"; Jul. 27-30, 2015; 4 pages.

* cited by examiner

US 10,380,386 B1

ACCELERATOR FOR K-MEANS CLUSTERING WITH MEMRISTOR CROSSBARS

STATEMENT OF GOVERNMENT SUPPORT

This invention was made with government support under Contract No. 2017-17013000002 awarded by IARPA. The Government has certain rights in this invention.

BACKGROUND

K-means clustering is a method that may be used for clustering data points for a variety of applications. The k-means clustering method groups or segments t data points in an n-dimensional space into a set of k clusters. In other words, k-means clustering aims to partition n observations into k clusters in which each observation belongs to the cluster with the nearest mean. K-means clustering is an iterative approach to classification of the data points.

A memristor crossbar array structure can carry out vector-matrix multiplication. By applying a vector of voltage signals to the rows of a memristor crossbar array, multiplication by each element's conductance is carried out. The memristor crossbar array structure may be further configured to accelerate performance of k-means clustering for vector data sets over traditional digital ASIC processing.

SUMMARY

Embodiments of the present disclosure are directed to a memristive dot product system for vector processing, and related method and non-transitory computer storage device storing instructions operable to cause one or more computer processors to perform the method.

In one embodiment, a crossbar array includes a number of memory elements. The crossbar array has N rows, M columns and N×M memory elements. A vector input register has N voltage inputs to the crossbar array. A vector output register has M voltage outputs from the crossbar array. An analog-to-digital converter (ADC) is electronically coupled to the vector output register. A digital-to-analog converter (DAC) is electronically coupled to the vector input register. A clustering processor is electronically coupled to the ADC and to the DAC. The clustering processor is configured to program columns of the crossbar array with a set of k cluster center values, to apply voltages to rows of the crossbar array where the applied voltages represent a set of data values, and to determine a minimum distance of each data value to each k cluster center values based on the voltage output from the output register of each of the plurality of the programmed columns.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Examples of the subject matter claimed below will now be disclosed. In the interest of clarity, not all features of an actual implementation are described in this specification. It will be appreciated that in the development of any such actual example, numerous implementation-specific decisions may be made to achieve the developer's specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

K-means clustering is a method that may be used for clustering data points for a variety of applications. The k-means clustering method groups or segments t data points in an n-dimensional space into a set of k clusters. In other words, k-means clustering aims to partition n observations into k clusters in which each observation belongs to the cluster with the nearest mean. K-means clustering is an iterative approach to classification of the data points.

The k-means clustering method may be performed in two general steps: assignment of data points to a closest cluster center, and an update of the cluster center values. One example of a k-means clustering method is known as the Lloyd's algorithm which proceeds by alternating between an assignment step and an update step.

In the assignment step, each data point is assigned to a particular k cluster center to the nearest cluster center value (also referred to as cluster means). One way to determine the closest center value to a data point is by determining the cluster center whose mean has the least squared Euclidean distance to the data point.

After the data points are assigned to their nearest cluster center, the assigned data points for a respective cluster center are then averaged together to find a new cluster center (i.e., a new cluster mean). After determining new cluster centers, then the method repeats using the new set of cluster centers in the assignment step.

The assignment step, and the update step continue until the method has converged. Convergence may be determined when the assignment of data points no longer changes. Additionally, the iterative steps may be set to a threshold or limited number of iterations. This may be necessary, if the optimum cluster center is not found, and the cluster centers begin alternating between a few points.

Figure 1:
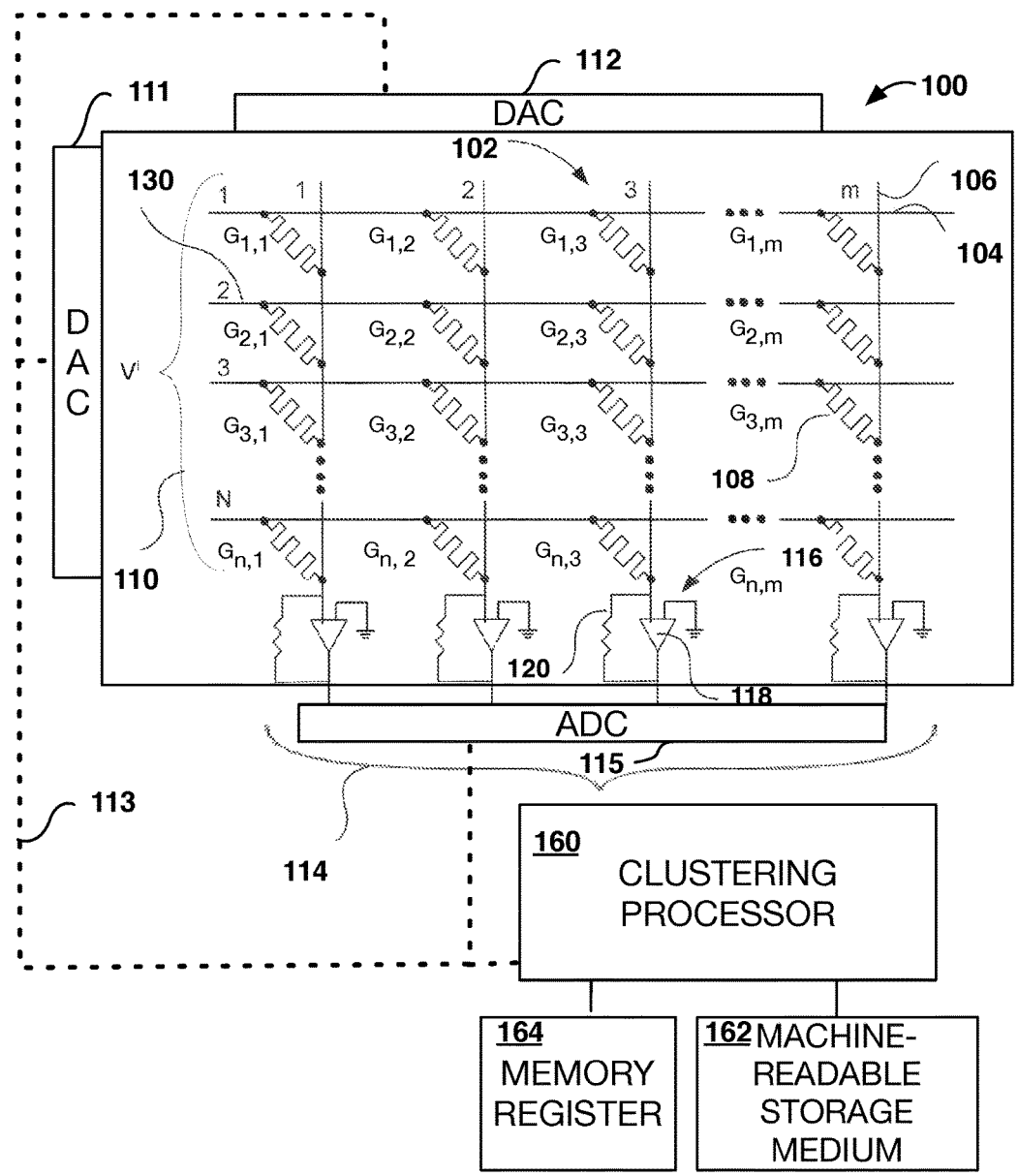
FIG. 1 is a diagram of an example memristive dot-product engine with a clustering processor.

An example memristive crossbar array is now described for use in k-means clustering. While a particular example of a memristive crossbar array is described, other configurations of memristive crossbar arrays may be used. FIG. 1 illustrates a memristive dot-product engine 100, also referred to as the dot-product system, having a single vector of voltage. The dot-product engine 100 includes a crossbar array 102 including N row electrodes 104 and M column electrodes 106. The crossbar junctions throughout the crossbar array 102 include a memristive element 108. The dot-product engine 100 includes a vector input register or vector input 110 for applying voltages to the row electrodes 104 and a vector output register or vector output 114 for receiving output voltages resulting from current flows in the column electrodes 106. Additionally, the dot-product engine 100 includes input registers for columns to adjust the columns conductance.

The vector input may be coupled to digital to analog convertors 111 to convert digital values to analog values for writing to the crossbar array 102. The vector output 114 may include analog to digital converters 115 to convert analog values to digital values. The dot-product engine 100 also includes sense circuitry 116 for converting an electrical current in a column electrode 106 to a voltage. In an example, the sense circuitry 116 includes an operational amplifier 118 and a resistor 120, which can be arranged to represent a virtual ground for read operations.

The dot-product engine 100 may also include other peripheral circuitry associated with crossbar arrays 102 used as storage devices. For example, the vector input 110 may include drivers connected to the row electrodes 104. An address decoder can be used to select a row electrode 104 and activate a driver corresponding to the selected row electrode 104. The driver for a selected row electrode 104 can drive a corresponding row electrode 104 with different voltages corresponding to a vector-matrix multiplication or the process of setting resistance values within the memristive elements 108 of the crossbar array 102 thereby forming a memory element of the dot-product engine. Each memory element may include a memristor and a transistor in series with one another. Similar driver and decoder circuitry may be included for the column electrodes 106. Control circuitry may also be used to control application of voltages at the inputs and reading of voltages at the outputs of the dot-product engine 100. Digital to analog circuitry and analog to digital circuitry may be used at the vector inputs 110 and at the vector output 114. Input signals to the row electrodes 104 and column electrodes 106 can be either analog or digital. The peripheral circuitry above described can be fabricated using semiconductor processing techniques in the same integrated structure or semiconductor die as the crossbar array 102 in the above example. As described in further detail below, there are two main operations that occur during operation of the dot-product engine. The first operation is to program the memristors in the crossbar array so as to map the mathematic values in an N×M matrix to the array. In one example, only one memristor is programmed at a time during the programming operation. The second operation is the dot-product or matrix multiplication operation. In this operation, input voltages are applied and output voltages obtained, corresponding to the result of multiplying an N×M matrix by an N×1 vector. The input voltages are below the threshold of the programming voltages so the resistance values of the memristors in the array 102 are not changed during the matrix multiplication operation.

The dot product engine 100 may include analog-to-digital converters 115 to convert analog signals of the vector output register 114 to digital values. The dot product engine 100 may include digital-to-analog converters to convert digital values to an analog values to the column input register. The dot product engine 100 may include a digital-to-analog converter to convert digital values to analog values to the vector input register 110.

Input to the vector input register may be a vector of voltages $\{V_n\}$. Input to the column input register may be an array of conductances $\{G_{nm}\}$. The vector output register may be a vector of currents $\{I_m\}$. The following formula may be used to determine the vector output based on the vector input and the column input, $I_m = \Sigma_n G_{nm} \cdot V_n$.

The dot product engine 100 may be electronically coupled to clustering processor 160. The clustering processor 160 may be integrally coupled to the dot product engine 100 and formed as a part thereof. The clustering processor 160 may be a separate component, such as an integrated circuit, or separate processor. The clustering processor 160 may be one or more central processing units (CPUs), semiconductor-based microprocessors, and/or other hardware devices suitable for retrieval and execution of instructions stored in machine-readable storage medium. The clustering processor may fetch, decode, and execute instructions, to control processes for performing k-means clustering with the crossbar array. As an alternative or in addition to retrieving, and executing instructions, the clustering processor 160 may include one or more electronic circuits that include electronic components for performing the functionality of one or more instructions, e.g., a Field Programmable Gate Array (FPGA) or Application Specific Integrated Circuit (ASIC). The clustering processor may include memory for storing executable instructions, and/or be couple to a separate storage medium 162. The clustering processor 160 may be electronically coupled via electronic circuit 113 to DAC 112 to program a column of the crossbar array 102. The clustering process may be electronically coupled via electronic circuit 113 to DAC 112 to apply data values as voltages to the crossbar array. The clustering processor 160 may be electronically coupled via electronic circuit 113 to ADC 115 to receive an output from the crossbar array 102. The clustering processor 160 may be electrically coupled to a memory register 164 or cache to retrieve input vector data. The data may be static, or may be updated periodically, for example in streaming context.

The dot product system may include two modes of operation: 1) dot-product computation, and 2) programming memristor array analog values. If an array of voltage signals is applied to the rows of a crossbar via vector input 110, the current measured at a column will be a weighted summation of the inputs with each input being multiplied by the conductance or 'weight' of the corresponding cross-point memristive device. Multiply-add operation is performed concurrently in all the layers as well within each layer of crossbar and the resulting currents are summed at the output using CMOS circuitry.

A machine-readable storage medium, such as 162, may include both volatile and nonvolatile, removable and non-removable media, and may be any electronic, magnetic, optical, or other physical storage device that contains or stores executable instructions, data structures, program module, or other data accessible to clustering processor 160, for example firmware, erasable programmable read-only memory (EPROM), random access memory (RAM), non-volatile random access memory (NVRAM), optical disk, solid state drive (SSD), flash memory chips, and the like. The machine-readable storage medium may be a non-transitory storage medium, where the term "non-transitory" does not encompass transitory propagating signals.

Figure 2:
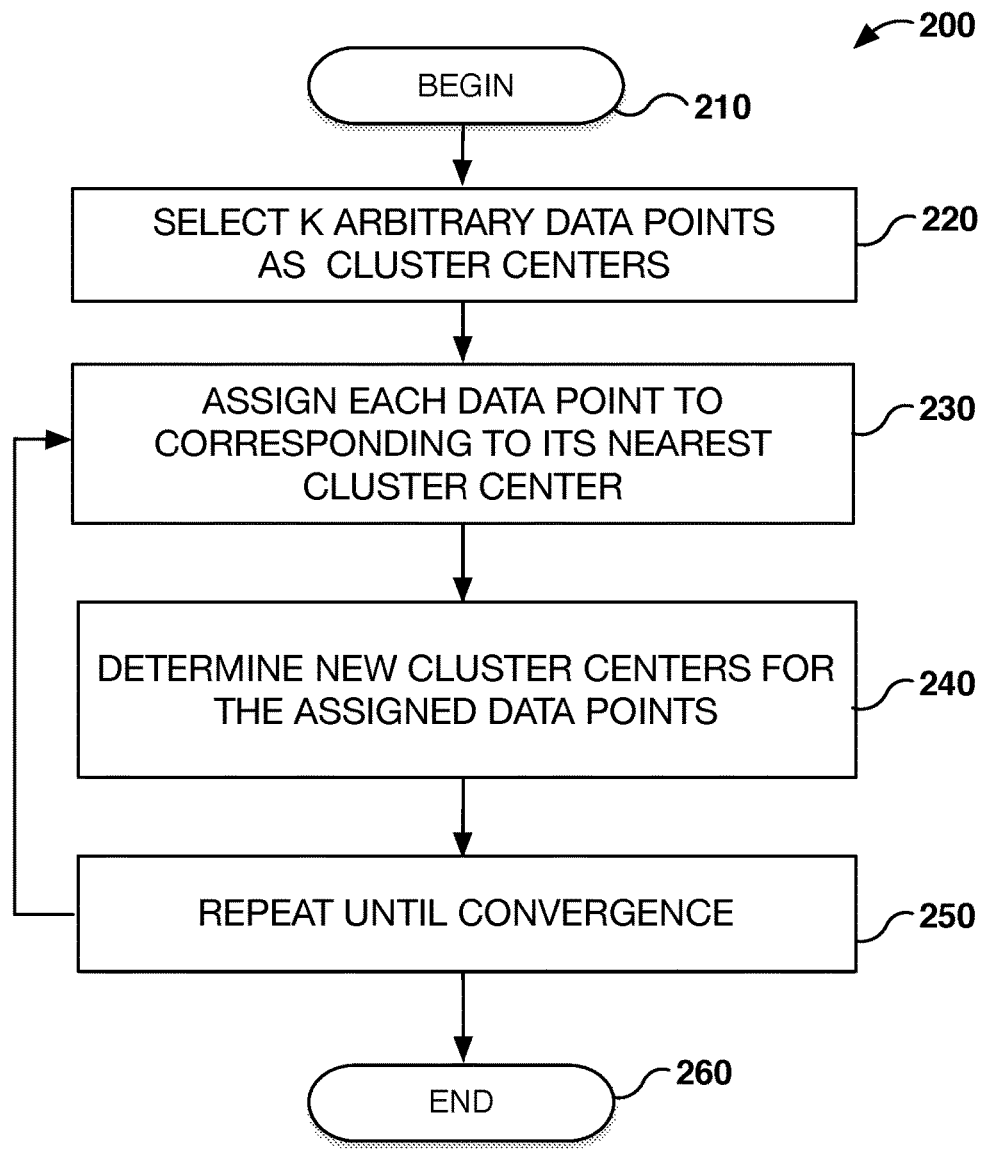
FIG. 2 is a flowchart of an example method for performing k-means clustering.

Referring now to FIG. 2, an example method 200 of k-means clustering is described. A k arbitrary number of data points are selected as cluster centers (block 220). The number of k cluster centers selected may be based on the number of groupings desired. The k cluster centers may be randomly chosen data points to begin as the cluster centers. Each of the data points are assigned to the nearest cluster center (block 230). The method then determines new cluster centers for the assigned data points. (block 240). The method continues until convergence (block 250).

Figure 3:
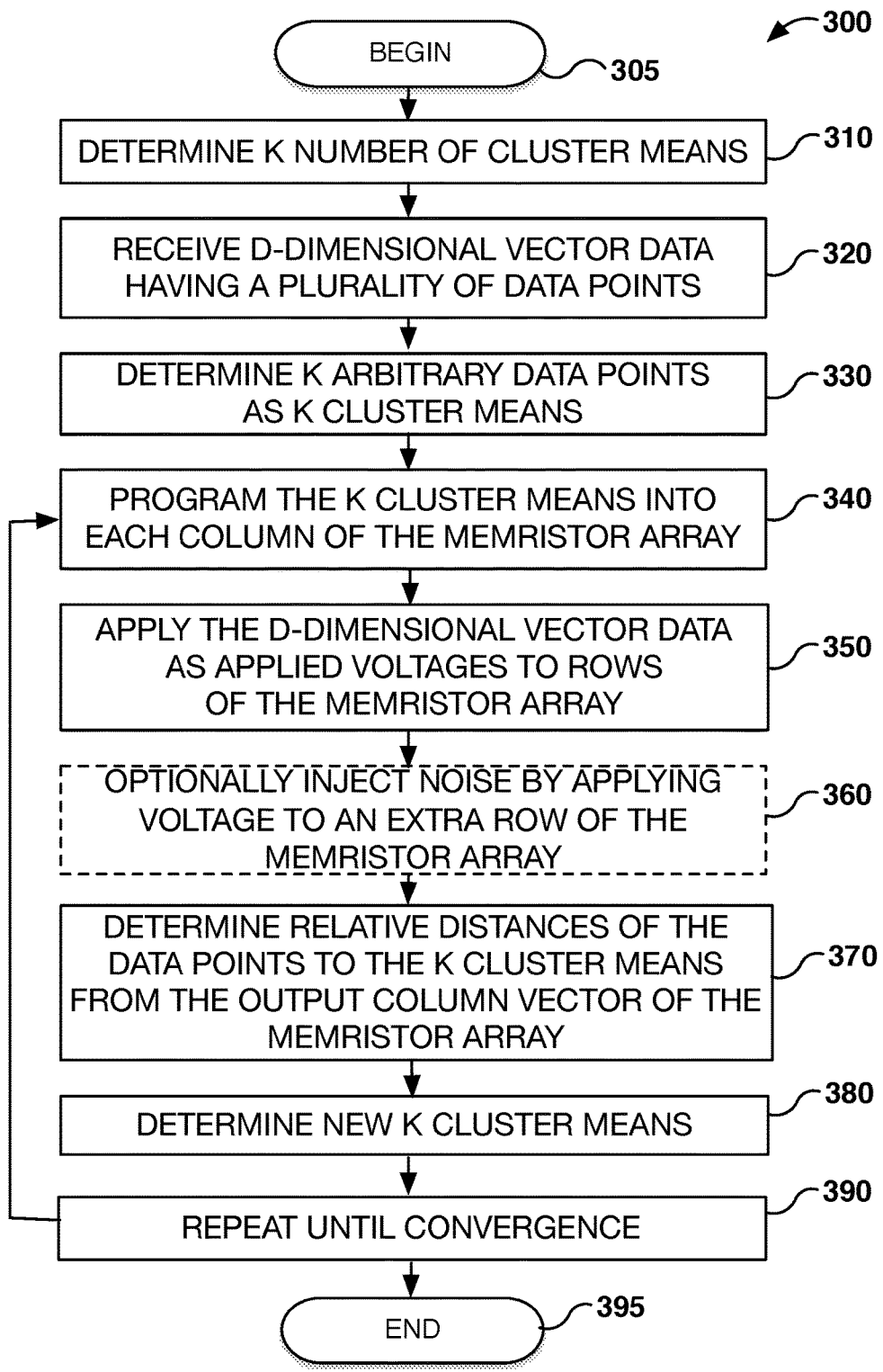
FIG. 3 is a flowchart of an example method of k-means clustering with a memristor cross-bar array.

Referring to FIG. 3, an example method 300 of k-means clustering with a memristor cross-bar array is described. The clustering processor 160 may perform a method for k-means clustering using the cross-bar array to determine Euclidean distances for data point values to k cluster centers.

A k number of cluster means is determined by the processor based on the number of data points of a vector data input, or by an input value to be used as the number of k clusters (block 310). A set of d-dimensional input data having a plurality of data points is received by the system. This received input data may be stored in a memory register accessible to the processor.

The system determines an initial k arbitrary data points for the number of k clusters needed (block 330). The data points may be randomly assigned as starting cluster means values. A digital based randomizer process may be used to determine random data values. The system programs the values of the k cluster means into each column of the memristor array (block 340). For example, if 5 cluster means are used, each of the 5 cluster means values are programmed into the columns of the crossbar array. In this example, there would be 5 columns of the memristor array programmed with respective values for the cluster means.

Each of the k cluster means values may be a vector having multiple data elements. For example, a k cluster means value may be a vector with a set of numeric data values. Each data value of the vector may be programmed into multiple different n rows of a particular m column of the crossbar array. And each of the k cluster mean vectors, the vector values $k=(k_1, k_2, \ldots k_n)$ may be programmed into multiple different m columns of the crossbar array. The crossbar array may be programmed according to the formula $G_{nm}=k^m_n$ for each cluster mean $k^m$, where n is an index value for a row of the crossbar array, and m is an index value for a column of the crossbar array. $G_{nm}$ is programmed for each data element of the cluster mean vector. $k^m$ represents an instance of a mean vector for a cluster. For example, for a 5 dimensional space, the cluster mean vector would have 5 coeffcients or values, and the crossbar array would be programmed where $G_{1m}=k^m_1$, $G_{2m}=k^m_2$, $G_{3m}=k^m_3$, $G_{4m}=k^m_4$ and $G_{5m}=k^m_5$.

The elements in each column of the memristor array are programmed as conductances. The conductance value is mapped to a possible range of numeric values. The k cluster means values are encoded or programmed into the columns of the crossbar array. In other words, a real number for the k cluster means value is mapped or translated into a conductance value in the column of the crossbar array.

An alternative method of initializing the columns with k arbitrary starting clusters is by applying random voltages to the rows, and random voltages to the columns at the same time. For example, applying random pulse sequences to the rows and columns may generate a random initial set of k cluster values. Every memristor will receive a voltage which would be the difference between its row and its column. Each column would correspondingly get programmed to a unique value. In this manner, each of the columns would be initialized with unique k cluster values.

Vector data values are then applied as applied voltages to rows of the memristor array (block 350). Each data point of the vector data is applied to the memristor array as voltages.

Optionally, the system may inject noise into the memristor array by applying a voltage to an extra row of the memristor array (block 360). Basically, error or noise may be introduced into the dot product calculations which may result in a different closest k cluster center to a data point being determined. Adding noise into the dot product calculations may help avoid cluster center calculations from becoming trapped in a local minimum.

The system then determines the relative distances of the data points to the k cluster means from the output column vector of the memristor array (block 370). The shortest distance may be determined by the minimum Euclidean distance from a data point {d} to the k cluster centers. For example, the Euclidean distance between two points in n-dimensional space where $p=(p1, p2 \ldots pn)$ and $q=(q1, q2 \ldots qn)$ may be determined by the formula $sqrt[|p|^2+|q|^2-2p \cdot q]$. With the crossbar array, one may calculate the $2p \cdot q$ term efficiently, and for a particular point/vector $|p|^2$ is a constant term, the contribution from the cluster mean vector (for example as for q outlined above) may be handled—either by 1) adding each column's unique contribution $|q|^2$ to the measured result $I_m=\Sigma_n G_{nm} \cdot V_n$ which is essentially the $p \cdot q$ term, or by 2) ensuring as programmed each cluster vector is unit normalized such that $|q|^2=1$ for all clusters before the minimum distance cluster is determined by the program.

To determine the minimum Euclidean distance, the system identifies the maximum dot product value from the output column vector of the memristor array. The Euclidean distance is related to the negative of the dot product. Picking the max $I_m$, of columns storing the cluster means vector $k^m_n$ values, where $I_m=\Sigma_n G_{nm} \cdot V_n$ then determines the closest $k^m$ for a particular data point {d}. It may be assumed that the cluster means are unit normalized in $G_{nm}$ programming following this approach. Otherwise, $|k^m|^2$ may also be accounted for to determine the closest cluster.

The numeric values of the evaluated data point and the determined corresponding cluster center may be stored in a memory register. Additionally, the data may be encoded into a second crossbar array. The data points may be encoded in a row of the second crossbar array with n columns for an n-dimensional vector. Such a second crossbar array could directly drive the first crossbar array when supplying data vectors to the row electrodes of that first crossbar system. This would be accomplished by, for any desired data vector in the second crossbar array, the corresponding row electrodes of the second crossbar array would be driven with a positive voltage while all other rows would be driven with zero voltage. The output vector of the columns would thus be proportional to the desired data vector, which could drive the inputs to the first crossbar array. Additional rows or columns in the second crossbar array may be used to store the k-means cluster value that the data point is assigned to.

The system determines new k cluster means (block 380). The system has now assigned data points to respective k cluster centers. The system then determines a new mean value, or new center value, by calculating a mean value for all of the data points assigned to a particular k cluster center.

The system determines whether the data points have converged to a particular cluster center means. If the data points have converged, then the method ends (block 395), otherwise, block 340 is repeated using the new k cluster means determined in block 380.

The new k cluster means values may be updated in the crossbar array using different approaches. The first approach is to program the conductances of the columns as described above to encode the new k cluster means values. In this case, the columns are programmed to the particular conductance for the respective new k cluster means values.

An approach to update the columns with the new k cluster means values is by nudging or adjusting the already programmed conductance values of a column by applying a voltage to the programmed column. The processor may calculate a delta Δ between the old k cluster means value and the new k cluster means values, $\Delta = k^m(\text{old}) - k^m(\text{new})$. This delta may be a set of positive or negative numbers. Based on the delta values, a set of positive or negative voltages may be applied to the rows, while simultaneously grounding (applying 0 voltage) to the chosen column to "nudge" or adjust the conductance of the column to the desired conductance. All other columns in this operation would be left "floating" (no applied voltage potential) so that these conductances would not be affected. Larger voltages may move the value, for example 1 to 2 volts, whereas smaller applied voltages 0.2 volts or less may not change the conductance value. Larger positive voltages can increase the conductance, while larger negative voltages would decrease the conductance. The overall amount of the increase or decrease of the conductance is proportional to the voltage applied, or proportional to the duration of time the voltage is applied. The longer amount of time a voltage is applied, then the greater the change in conductance. A similar operation would be applied to each target column based on the corresponding delta values for that cluster mean.

Figure 4:
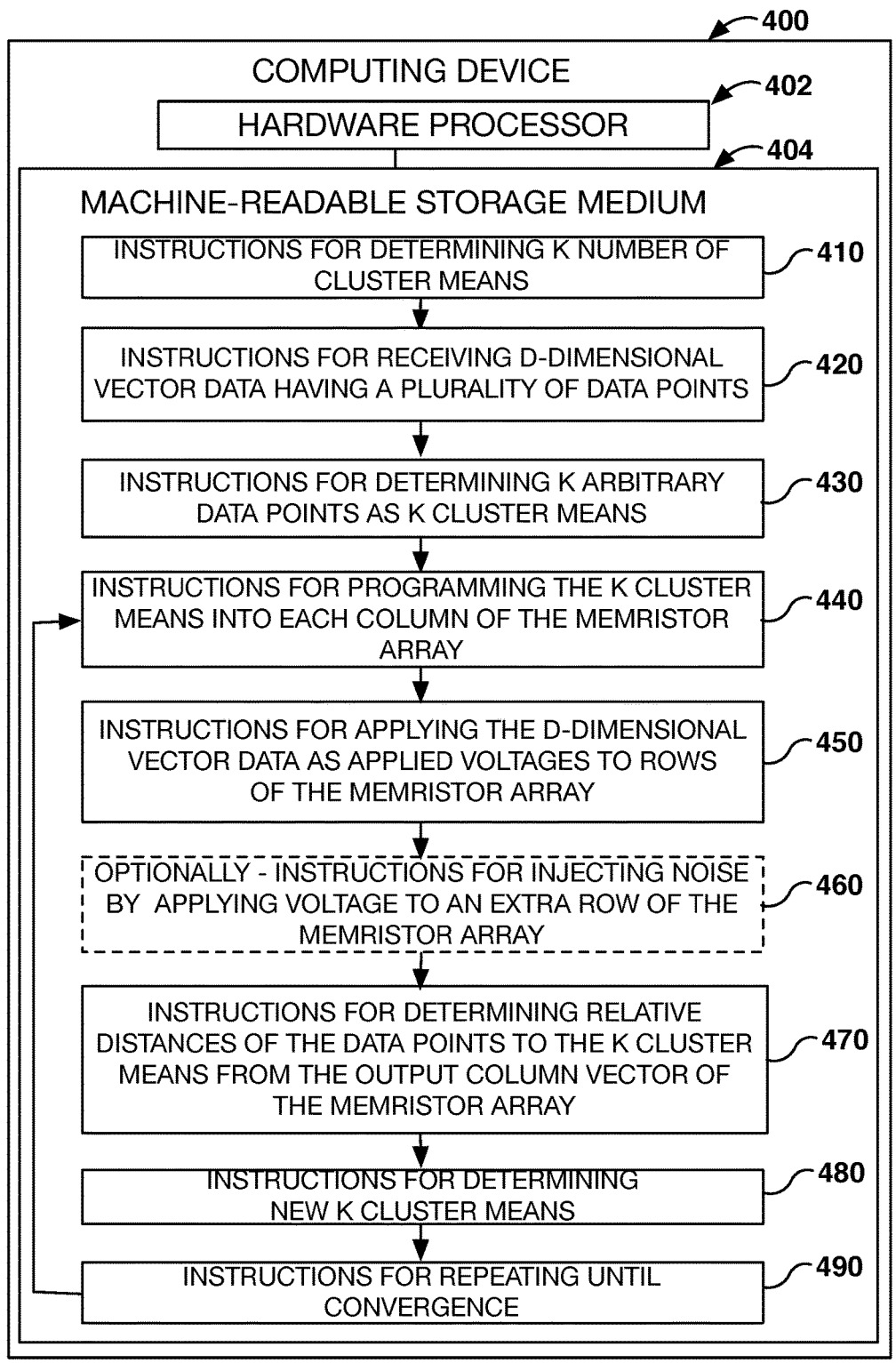
FIG. 4 is an example computing device with a hardware processor and accessible machine readable instructions for performing k-means clustering with a memristor cross-bar array.

FIG. 4 is an example computing device 400 with a hardware processor 402, with machine readable instructions 404 for performing k-means clustering with a memristor cross-bar array. As described in detail below, the machine-readable storage medium may be encoded with executable instructions 410-490, for performing k-means clustering with a memristor cross-bar array.

The executable instructions include instructions for determining k number of cluster means (block 410); instructions for receiving d-dimensional vector data having a plurality of data points (block 420); instructions for determining k arbitrary data points as k cluster means (block 430); instructions for programming the k cluster means into each column of the memristor array (block 440); instructions for applying the d-dimensional vector data as applied voltages to rows of the memristor array (block 450); instructions for injecting noise by applying voltage to extra row of the memristor array (block 460); instructions for determining relative distances of the data points to the k cluster means from the output column vector of the memristsor array (block 470); instructions for determining new k cluster means (block 480); and instructions for repeating blocks 440-480 until convergence (block 490).

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

We claim:

1. A memristive dot product system for vector processing, comprising:
   a crossbar array having a number of memory elements, the crossbar array having N rows, M columns and N×M memory elements;
   a vector input register comprising N voltage inputs to the crossbar array;
   a vector output register comprising M voltage outputs from the crossbar array; and
   an analog-to-digital converter (ADC) electronically coupled to the vector output register;
   a digital-to-analog converter (DAC) electronically coupled to the vector input register;
   a clustering processor electronically coupled to the ADC and to the DAC, the clustering processor configured to:
      program a plurality of columns of the crossbar array with a first set of k cluster center values;
      apply voltages to a plurality of rows of the crossbar array, the applied voltages representing a set of data values;
      inject a noise signal by applying a voltage to another row of the crossbar array in addition to the voltages applied to the plurality of rows; and
      determine a minimum distance of each data value to each k cluster center values based on the voltage output from the output register of each of the plurality of the programmed columns.

2. The dot product system of claim 1, wherein the clustering processor is further configured to:
   determine a second set of k cluster center values; and
   program the plurality of columns of the crossbar array with the second set of k cluster center values, thereby replacing the first set of k cluster center values previously programmed in the plurality of columns.

3. The dot product system of claim 1, wherein the data values comprise d-dimensional vector data having a plurality of data points of numeric values.

4. The dot product system of claim 1, wherein determine a minimum distance comprises:
   determine one of the k cluster center values as being the k cluster center value closest to a data value as being the column of the output register having the lowest voltage value.

5. The dot product system of claim 1, wherein the clustering processor is further configured to:
   assign each data value to a particular k cluster center value, wherein the data value is assigned to the k cluster center value having the minimum distance as to one of the k cluster centers of the programmed columns; and
   determine a second set of k cluster center values by calculating a new mean k cluster center value for those data values assigned to the particular k cluster center value.

6. The dot product system of claim 5, wherein the clustering processor is further configured to:
   update programmed columns with the second set of k cluster center values by applying a voltage to a column to adjust the conductance.

7. A method comprising:
   programming a plurality of columns of a memristor crossbar array with a first set of k cluster center values, each memory element comprising a memristor and a transistor in series with one another, the crossbar array having N rows, M columns and N×M memory elements;
   applying voltages to a plurality of rows of the crossbar array, the applied voltages representing a set of data values;

injecting a noise signal by applying a voltage to another row of the crossbar array in addition to the voltages applied to the plurality of rows; and determining a minimum distance of each data value to each k cluster center values based on the voltage output from the output register of each of the plurality of the programmed columns.

8. The method of claim 7, further comprising:

determining a second set of k cluster center values; and programming the plurality of columns of the crossbar array with the second set of k cluster center values, thereby replacing the first set of k cluster center values previously programmed in the plurality of columns.

9. The method of claim 7, wherein the data values comprise d-dimensional vector data having a plurality of data points of numeric values.

10. The method of claim 7, further comprising:

determining one of the k cluster center values as being the k cluster center value closest to a data value as being the column of the output register having the lowest voltage value.

11. The method of claim 7, further comprising:

assign each data value to a particular k cluster center value, wherein the data value is assigned to the k cluster center value having the minimum distance as to one of the k cluster centers of the programmed columns; and determine a second set of k cluster center values by calculating a new mean k cluster center value for those data values assigned to the particular k cluster center value.

12. The method of claim 7, further comprising:

update programmed columns with the second set of k cluster center values by applying a voltage to a column to adjust the conductance.

13. A non-transitory computer storage device storing instructions operable to cause one or more computer methods to perform operations comprising:

programming a plurality of columns of a memristor crossbar array with a first set of k cluster center values, each memory element comprising a memristor and a transistor in series with one another, the crossbar array having N rows, M columns and N×M memory elements;

applying voltages to a plurality of rows of the crossbar array, the applied voltages representing a set of data values;

injecting a noise signal by applying a voltage to another row of the crossbar array in addition to the voltages applied to the plurality of rows; and determining a minimum distance of each data value to each k cluster center values based on the voltage output from the output register of each of the plurality of the programmed columns.

14. The non-transitory computer storage device of claim 13, the operations further comprising:

determining a second set of k cluster center values; and programming the plurality of columns of the crossbar array with the second set of k cluster center values, thereby replacing the first set of k cluster center values previously programmed in the plurality of columns.

15. The non-transitory computer storage device of claim 13, where the determining a minimum distance the operations further comprise:

determining one of the k cluster center values as being the k cluster center value closest to a data value as being the column of the output register having the lowest voltage value.

16. The non-transitory computer storage device of claim 13, the operations further comprising:

assigning each data value to a particular k cluster center value, wherein the data value is assigned to the k cluster center value having the minimum distance as to one of the k cluster centers of the programmed columns; and determine a second set of k cluster center values by calculating a new mean k cluster center value for those data values assigned to the particular k cluster center value.

17. The non-transitory computer storage device of claim 13, the operations further comprising:

update programmed columns with the second set of k cluster center values by applying a voltage to a column to adjust the conductance.

* * * * *